United States Patent [19]

Kurz

[11] Patent Number: 5,050,151

[45] Date of Patent: Sep. 17, 1991

[54] APPARATUS FOR PLAYING BACK DATA READ OUT OF DATA TRACKS ON A RECORDED MEDIUM

[75] Inventor: Arthur Kurz, Karlsruhe, Fed. Rep. of Germany

[73] Assignee: Deutsche Thomson-Brandt GmbH, Villingen-Schwenningen, Fed. Rep. of Germany

[21] Appl. No.: 250,730

[22] Filed: Sep. 28, 1988

[30] Foreign Application Priority Data

Sep. 30, 1987 [DE] Fed. Rep. of Germany ....... 3732941

[51] Int. Cl.$^5$ .............................................. G11B 7/095
[52] U.S. Cl. .......................... 369/44.290; 369/44.320; 369/44.340
[58] Field of Search ............... 369/44.27, 44.29, 44.32, 369/44.34–44.36, 110, 124; 250/201.1, 202

[56] References Cited

U.S. PATENT DOCUMENTS

| 4,190,859 | 2/1980 | Kinjo | 369/44.36 X |
| 4,589,103 | 5/1986 | Tajima | 369/44.32 |
| 4,663,751 | 5/1987 | Kaku et al. | 369/44.32 X |
| 4,691,308 | 9/1987 | Takagi et al. | 369/110 X |
| 4,794,244 | 12/1988 | Kimura | 369/44.11 X |
| 4,807,207 | 2/1989 | Konno | 369/44.29 X |

Primary Examiner—Roy N. Envall, Jr.
Assistant Examiner—W. R. Young
Attorney, Agent, or Firm—Max Fogiel

[57] ABSTRACT

An arrangement for playing back data read out of data tracks on a recorded medium, in which a tracking circuit positions a beam of light on data tracks of the recorded medium. From a photodetector with a plurality of photodiodes, there are generated a data signal, a focusing-error signal, and a tracking-error signal. These signals result from the beam of light that is reflected by the recorded medium onto the photodetector. An offset-compensation voltage is applied to one input of a tracking control amplifier in the tracking circuit. The tracking error signal is generated from photovoltages of predetermined ones of photodiodes. The offset-compensation voltage is varied until one of the photovoltages is equal to the sum of the offset-compensation voltage and of another one of the photovoltages to maintain the operating point of the tracking circuit at an optimal midpoint.

10 Claims, 6 Drawing Sheets

APPARATUS FOR PLAYING BACK DATA READ OUT OF DATA TRACKS ON A RECORDED MEDIUM

BACKGROUND OF THE INVENTION

The invention concerns equipment for playing back data that can be read out of the data tracks on a recorded medium by an optical pick-up in that at least one beam of light can be focused on the recorded medium by a focusing circuit and positioned on the data tracks by a tracking circuit, in that the beam of light is reflected onto a photodetector by the recorded medium, and in that the photodetector generates an electric data signal, a focusing-error signal as an actual value for the focusing circuit, and a tracking-error signal as an actual value for the tracking circuit.

Equipment of this type—compact-disk players, optico-magnetic equipment for recording and playing back, and recording and playback equipment for draw disks or videodisc players for example—are provided with an optical pick-up consisting of a laser diode, several lenses, a prismatic beam divider, and a photodetector. The design and function of an optical pick-up are described in Electronic Components and applications 6 (1984) 4, 209–15.

The beam of light emitted by the laser diode is focused by lenses onto the compact disk, which reflects it onto a photodetector. The data stored on the disk and the actual value for the focusing and tracking circuits are obtained from the photodetector output signal. The aforecited passage calls the actual value for the focusing circuit a focusing error and the actual value for the tracking circuit a radial tracking error.

The element that controls the focusing circuit is a coil with an objective lens that travels along its optical axis within the magnetic field. The focusing circuit moves the lens back and forth to keep the beam of light emitted by the laser diode constantly on the compact disk. The tracking circuit, which is often called the radial drive mechanism, moves the optical pick-up radially over the compact disk, positioning the beam of light on the spiral data tracks on the disk.

The radial drive mechanism in some equipment is comprises what is called a coarse-drive mechanism and of what is called a fine-drive mechanism. The coarse-drive mechanism is for example in the form of a spindle that radially moves the overall optical pick-up consisting of the laser diode, the lenses, the prismatic beam divider, and the photodetector. The fine-drive mechanism can tilt the beam of light radially, at a prescribed slight angle for example, allowing the beam of light, due to the tilting alone, to travel a short distance along one radius of the compact disk.

FIG. 1 illustrates the photodetector PD in the optical pick-up of a compact-disk player wherein three beams L1, L2, and L3 of light are focused on the compact disk. A pick-up of this type is called a three-beam pick-up in the aforecited reference.

The photodetector has four square photodiodes A, B, C, and D connected to create another square. Diagonally opposite this square comprising the four photodiodes are two other square photodiodes E and F.

The middle laser beam L1, which is focused on the four photodiodes A, B, C, and D, generates a data signal $HF = AS + BS + CS + DS$ and a focusing-error signal $FE = (AS + CS) - (BS + DS)$. The two outer beams L2 and L3 of light, of which forward beam L2 strikes photodiode E and rear beam L3 strikes photodiode F, generate tracking-error signal $TE = ES - FS$. Photodiodes A, B, C, D, E, and F generate photovoltages AS, BS, CS, DS, ES, and FS. Due to an astigmatic collimator lens in the path of middle laser beam L1 in the optical pick-up, the beam strikes the large square that comprises the four photodiodes A, B, C, and D in the form of a circle when it is precisely focused on the square and the form of an ellipse when it is out of focus.

FIG. 1a represents the device in focus and precisely tracked, which will be discussed again later herein. Because the spot of light produced on the large square by laser beam L1 is in the shape of a circle, focusing-error signal $FE = (AS + CS) - (BS + DS) = 0$. The zero value of the signal informs the focusing circuit that the focus is precise.

FIG. 1b represents the device out of focus, with the compact disk too far from the objective lens. The focusing-error signal is negative: $FE = (AS + CS) - (BS + DS) < 0$. The negative value of the focusing-error signal informs the focusing circuit that the distance between the compact disk and the objective lens is too great. The adjustment mechanism in the focusing circuit accordingly moves the lens toward the disk until the focusing-error signal becomes zero.

FIG. 1c illustrates the opposite out-of-focus situation, with the objective lens too near the compact disk. The focusing-error signal has a positive value: $FE = -(AS + CS) - (BS + DS) > 0$, informing the focusing circuit that the lens is too near the disk, and the adjusting mechanism moves the lens away from the disk until the focusing-error signal becomes zero.

How the tracking circuit carries out its function will now be described.

The laser beams L1, L2, and L3 illustrated in FIGS. 1a, 1b, and 1c are precisely on track. The tracking-error signal has the value zero: $TE = ES - FS = 0$.

FIG. 1d illustrates the situation in which laser beams L1, L2, and L2 are displaced to the right of the track. The tracking-error signal has a negative value: $TE = ES - FS < 0$. The adjusting mechanism in the tracking circuit moves the optical pick-up to the left until the tracking-error signal becomes zero.

In the opposite situation, when the laser beams are displaced too far to the left of the track, the tracking-error signal is positive: $TE = ES - FS > 0$, and the adjusting mechanism will move the optical pick-up to the right until the tracking-error signal becomes zero.

The relationship between the input parameter, the actual tracking-error signal, and the output voltage UA of the tracking-circuit control amplifier will be evident from the amplifier's characteristic curve in FIG. 2. The ideal operating point for the control amplifier is at the zero point, where the coordinates intersect, because that is where the operating point will be functioning symmetrically, traveling the same distance on either side. Prerequisite, however, to the desired ideal position of the operating point are photodiodes E and F that are exactly equivalent and ideal. Since, however, photodiodes E and F are not actually completely equivalent and are accordingly also subjected to different offset voltages, the operating point will, even though the lack of symmetry is corrected by the control amplifier, be displaced out of the ideal position and for example into the actual position AP represented in FIG. 2. The travel of the tracking-circuit control amplifier will now be limited to one side.

SUMMARY OF THE INVENTION

The object of the invention is accordingly to improve the equipment to the extent that the tracking-circuit control amplifier will operate symmetrically.

This object is attained in accordance with the invention by an offset-compensation voltage at one input terminal of the tracking-circuit control amplifier that is varied until the photovoltages of the photodiodes that the tracking-error signal is obtained from are just high enough to maintain the operating point of the tracking-circuit control amplifier at the optimal midpoint.

DESCRIPTION OF THE PREFERRED EMBODIMENTS

There is a voltage +UB at the interconnected cathodes of the photodiodes E and F of photodetector PD. The anode of photodiode E is connected to the first input terminal of a controlled switch U1 and, by way of a resistor R1, to the inverting input terminal of a control amplifier TR, at the output terminal of which a tracking-error signal TE can be obtained. The anode of photodiode F is connected to the first input terminal of a controlled switch U2 and, through a resistor R2, to the noninverting input terminal of control amplifier TR, the output terminal of which is connected back to its own inverting input terminal by way of a resistor R3. There is a reference in the form of an alternating-current voltage UR at the two interconnected input terminal of controlled switches U1 and U2. The output terminal of controlled switch U1 is connected to the input terminal of an amplifier V1, the output terminal of which is connected to the input terminal of a low-pass filter TP1. The output terminal of controlled switch U2 is connected to the input terminal of an amplifier V2, the output terminal of which is connected to the input terminal of a low-pass filter TP2. The output terminal of low-pass filter TP1 is connected to the input terminal of a rectifier G1, the output terminal of which is connected to the inverting input terminal of a comparator K. The output terminal of low-pass filter TP2 is connected to the input terminal of a rectifier G2, the output terminal of which is connected to the noninverting input terminal of comparator K. The output terminal of comparator K is connected to the input terminal E1 of controls MP, the first output terminal A1 of which is connected to the input terminal of a digital-to-analog converter DA1, the second output terminal A2 of which is connected to the input terminal of a digital-to-analog converter DA2 and the third output terminal A3 of which is connected to the control input terminals of controlled switches U1 and U2.

Figure 1:
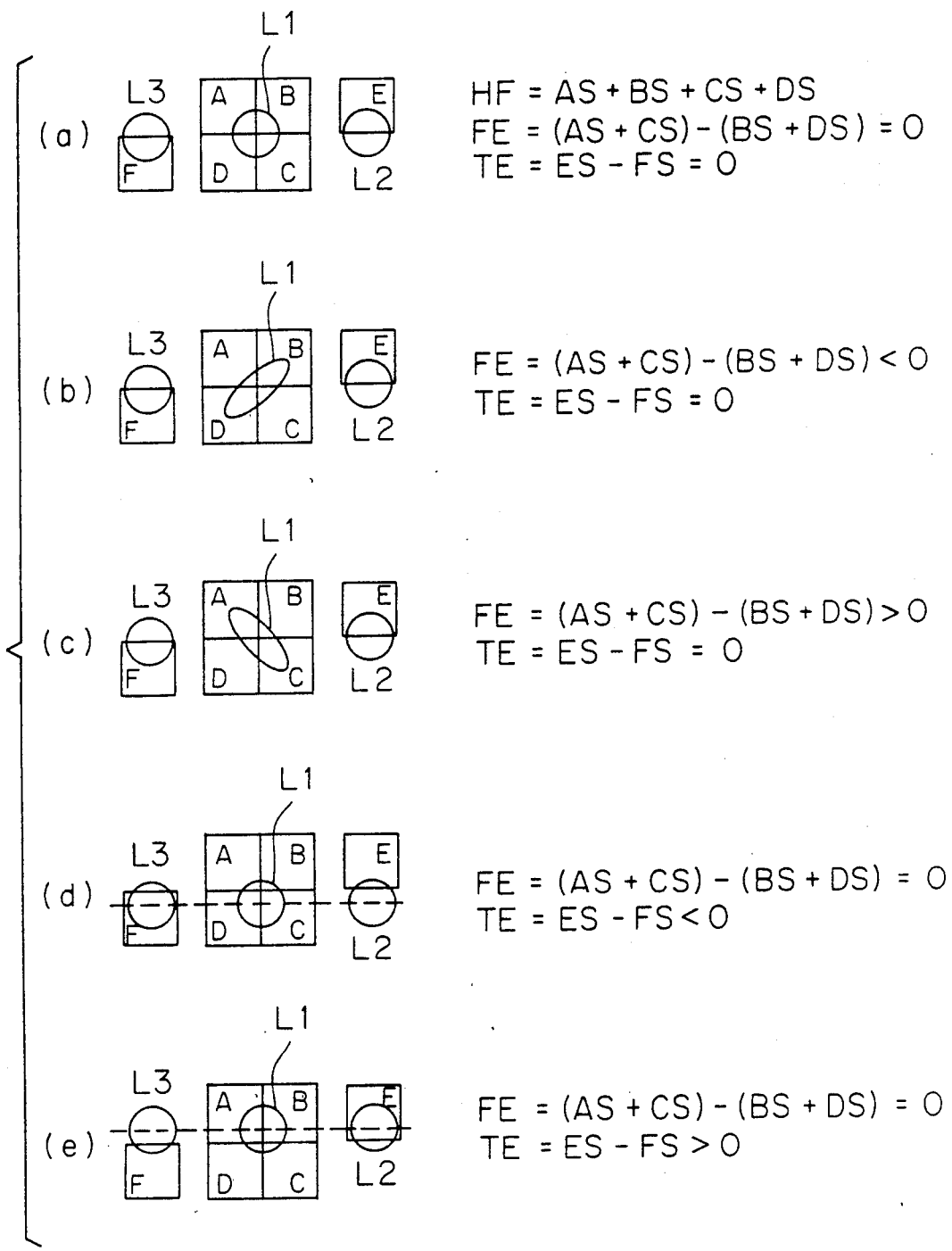
FIG. 1 is a schematic view and shows a photodetector in an optical pick-up of a compact disk player, in accordance with the present invention.
Figure 2:
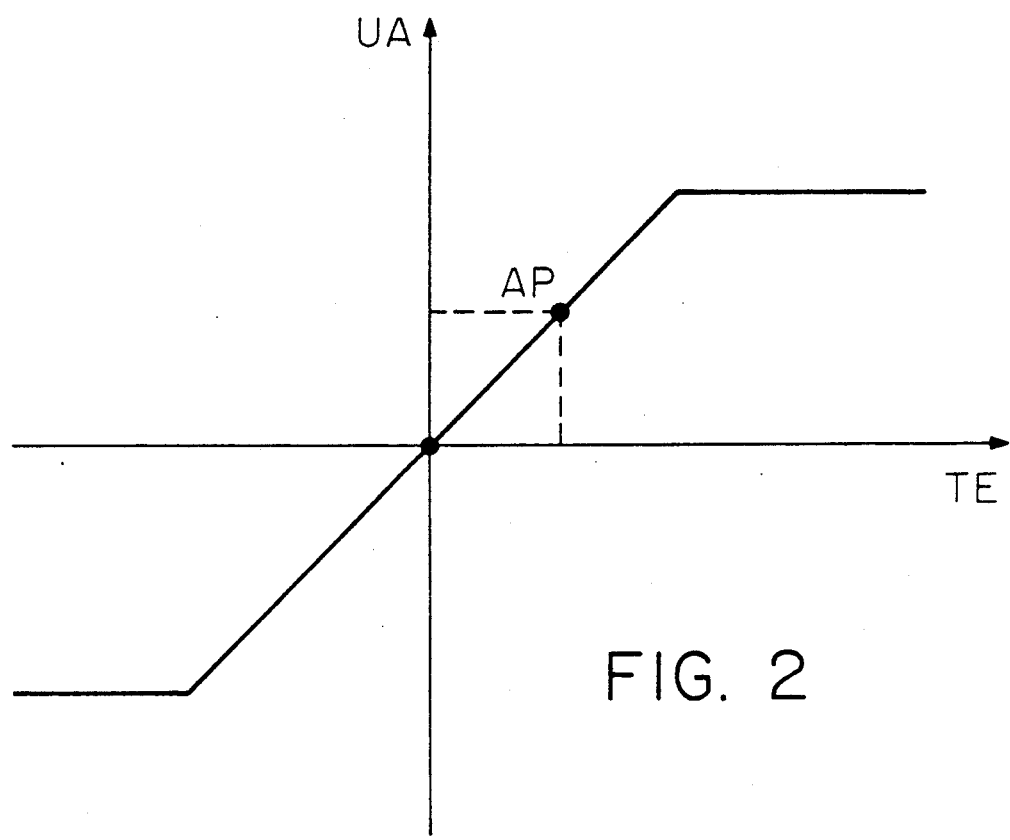
FIG. 2 is a graphical representation of an amplifier's characteristic curve.
Figure 3:
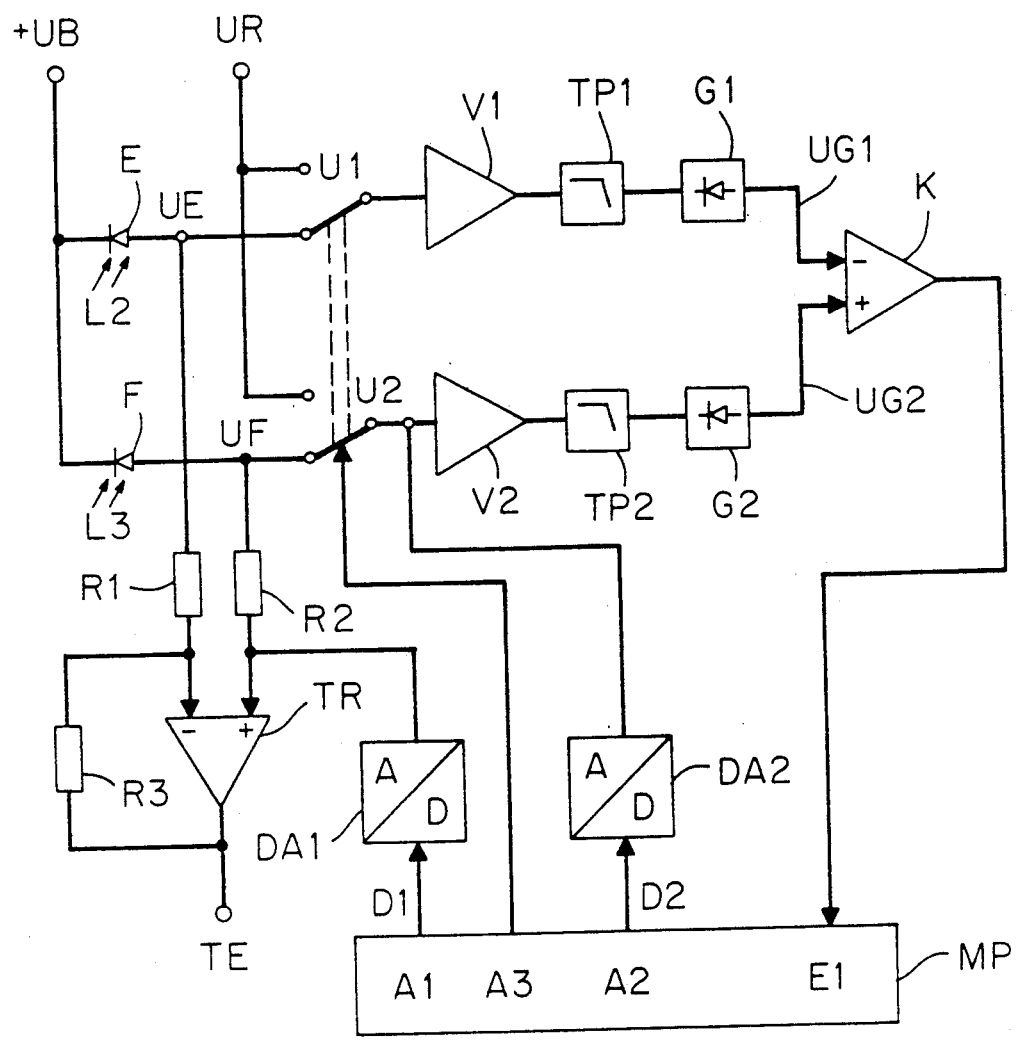
FIG. 3 is a schematic view and illustrates one embodiment of the invention.
Figure 5:
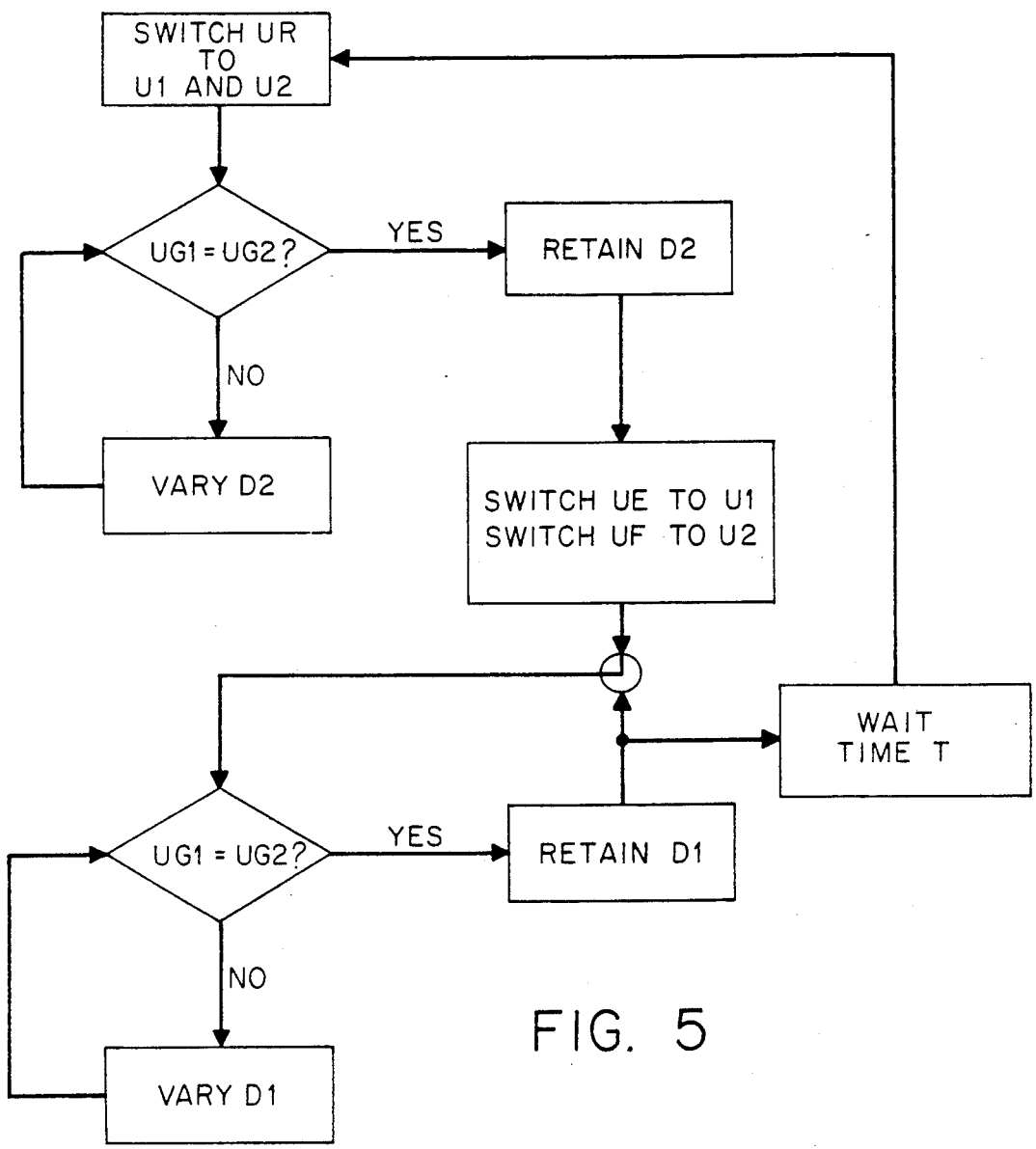
FIG. 5 is a flow diagram for FIG. 3.

A flow diagram for FIG. 3 is shown in FIG. 5.

When the compact-disk player is in operation, controls MP, which can very appropriately be a microprocessor, switch controlled switches U1 and U2 to reference voltage UR at periodic intervals, with the result that the same voltage will be present at both input terminals of comparator K. When, on the other hand, comparator K indicates by way of an offset voltage in the two signal paths that contain amplifiers V1 and V2, low-pass filters TP1 and TP2, and rectifiers G1 and G2 as well as the comparator itself, that the voltages at its input terminals are different, even though of the same dimension, controls MP will vary the digital value at its output terminal A2 until the output terminal of comparator K indicates that the voltages at its input terminals are equivalent. The digital value at the output terminal A2 of controls MP is converted by digital-to-analog converter DA2 into an analog offset-compensation voltage that compensates the offset voltage in amplifiers V1 and V2 and in comparator K.

At other times controlled switches U1 and U2 are in the opposite state, connecting photodiodes E and F to comparator K by way of amplifiers V1 and V2, low-pass filters TP1 and TP2, and rectifiers G1 and G2. Low-pass filters TP1 and TP2 filter the low-frequency components out of the output voltages of photodiodes E and F. Rectifiers G1 and G2 construct peak, effective, or mean values out of the components and forward them in that form to the input terminals of comparator K. If both photodiodes E and F were completely equivalent, the comparator K in controls MP would indicate the equivalence of its input voltages.

Since, however, photodiodes E and F are actual components, the voltages at the input terminals of comparator K are different. Although control amplifier TR could correct this difference if controls MP were not active, its operating point would not be at the ideal middle position, traveling an equal distance on each side, that is. Since, however, comparator K informs controls MP that its input voltages are different, the controls will vary the digital value at its output terminal A1, which is supplied by digital-to-analog converter DA1 in the form of an analog offset-compensation voltage to the noninverting input terminal of control amplifier TR, until the input voltages at comparator K are equal in dimension. The system operating point will now be back in its optimal position.

Neither manual compensation during manufacture nor subsequent-recompensation due to aging of the components will be necessary because automatic recompensation will be constantly occurring during operation.

Figure 4:
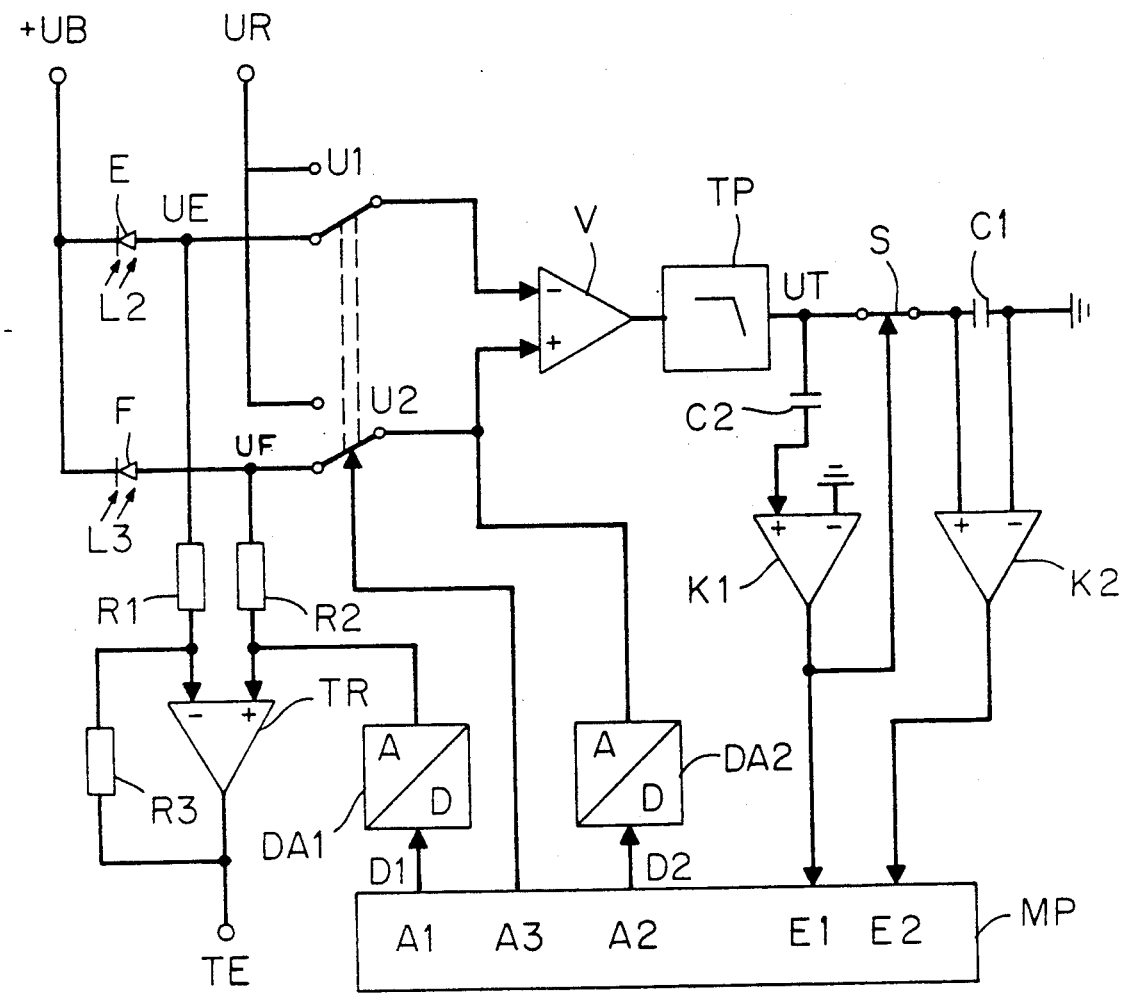
FIG. 4 is a schematic view of another embodiment of the invention.
Figure 6:
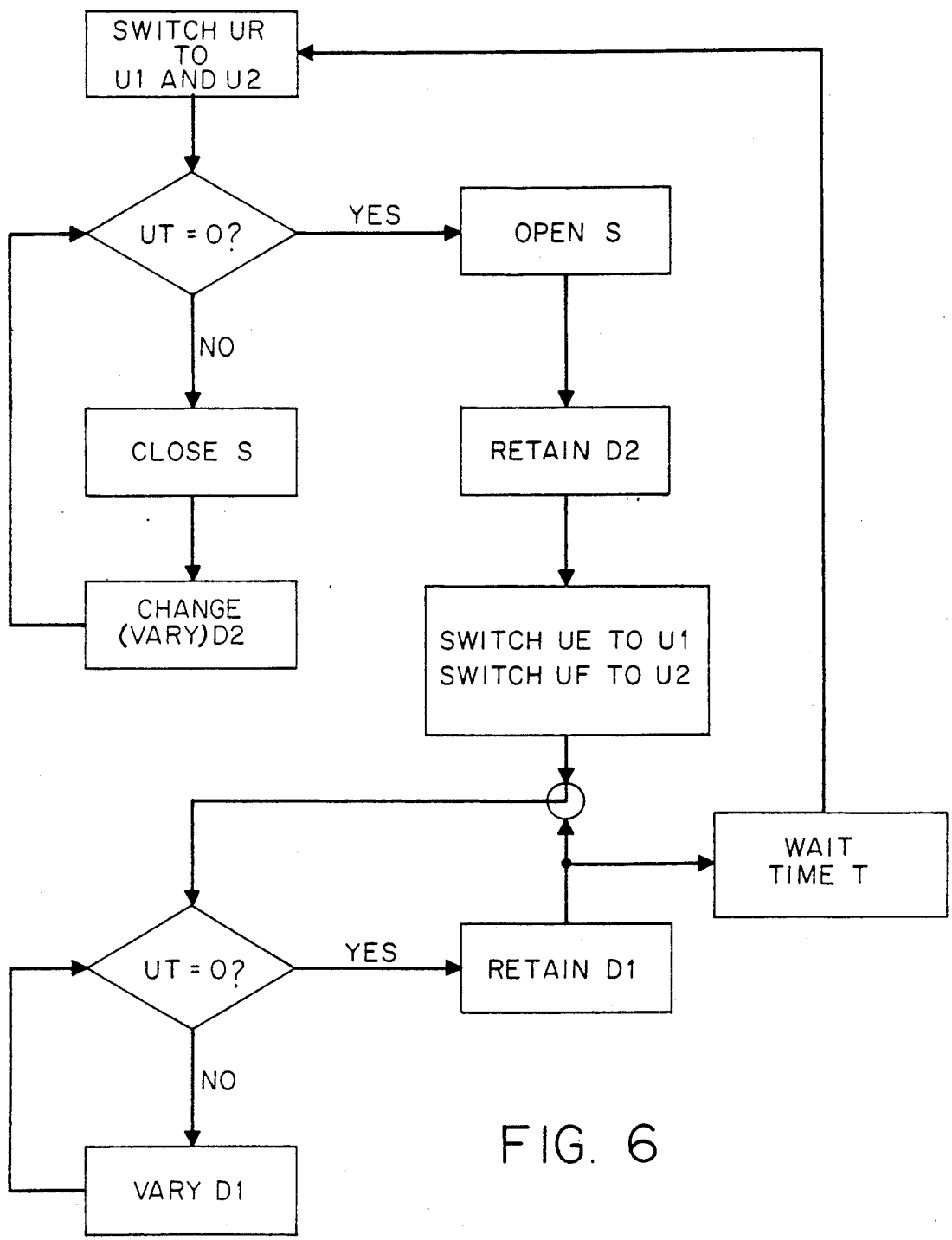
FIG. 6 is a flow diagram for FIG. 4.

In another embodiment, illustrated in FIG. 4, there is also a voltage +UB at the interconnected cathodes of photodiodes E and F. A flow diagram for FIG. 4 is illustrated by FIG. 6. The anode of photodiode E is connected to the first input terminal of a controlled switch U1 and, by way of a resistor R1, to the inverting input terminal of a control amplifier TR, at the output terminal of which a tracking-error signal TE can be obtained. The anode of photodiode F is connected to the first input terminal of a controlled switch U2 and, through a resistor R2, to the noninverting input terminal of control amplifier TR, the output terminal of which is connected back to its own inverting input terminal by way of a resistor R3. There is a reference in the form of an alternating-current voltage UR at the two interconnected input terminal of controlled switches U1 and U2. The output terminal of controlled switch U1 is connected to the inverting input terminal of a differential amplifier V, the output terminal of which is connected to the input terminal of a low-pass filter TP. The output terminal of controlled switch U2 is connected to the noninverting input terminal of differential amplifier V. The output terminal of low-pass filter TP is connected to one contact of a controlled switch S and, by way of a capacitor C2, to the noninverting input terminal of a comparator K1, the inverting input terminal of which is at reference potential. The noninverting input terminal of comparator K2 is connected to the other contact of controlled switch S and its inverting input terminal is at reference potential. Between the two input terminals of comparator K2 is a capacitor C1. The output terminal of comparator K1 is connected to the control input terminal of controlled switch S and to the first input terminal E1 of controls MP, the second output terminal A2 of which is connected to the output terminal of comparator K2. The first output terminal A1 of controls MP is connected to the input terminal of a digital-to-analog converter DA1, the output terminal of which is connected to the noninverting input terminal of control amplifier TR. The second output terminal A2 of controls MP is connected to the input terminal of a digital-to-analog converter DA2, the output terminal A2 of which is connected to the noninverting input terminal of differential amplifier V. The output terminal A3 of controls MP is connected to the control input terminals of controlled switches U1 and U2.

As in the first embodiment, when the compact-disk player is in operation, controlled switches U1 and U2 applies reference voltage UR to the input terminal of differential amplifier V. If differential amplifier V is subjected to an offset voltage, the comparator K1 in controls MP, which are preferably a microprocessor, indicates that the output signal of differential amplifier V is not zero. Controls MP accordingly vary the digital value at their output terminal A2 until the offset voltage of differential amplifier V is compensated by the offset-compensation voltage at the output terminal of digital-to-analog converter DA2. At other times the anodes of photodiodes E and F are connected to the input terminal of differential amplifier V by way of controlled switches U1 and U2. Sine photodiodes E and F are not ideal, there output voltages will be different. The voltage at the output terminal of differential amplifier V, and hence at the output terminal of low-pass filter TP, will accordingly not be zero. Comparator K2, which is provided with the direct-current components of the voltage at the output terminal of low-pass filter TP, informs the controls MP what the mathematical sign of the difference between the voltages of photodiodes E and F is. Comparator K1, on the other hand, the input terminal of which exhibits the alternating-current components of the voltage at the output terminal of low-pass filter TP, informs the controls MP what the dimension of the difference between the voltages of photodiodes E and F is. Controls MP accordingly vary the digital value at their output terminal A1, which is provided by digital-to-analog converter DA1 in the form of an analog offset-compensation voltage to the noninverting input terminal of control amplifier TR, until the voltages at the input terminals of differential amplifier V are equal in dimension, at which time controls MP open the previously closed controlled switch S. The system operating point will now, as in the case of the first embodiment, be at the optimal midposition, and the control amplifier TR will be operating symmetrically.

The invention is just as appropriate for draw-disk players, optico-magnetic equipment, and videodisk players as it is for compact-disk players.

What is claimed is:

1. An arrangement for playing back data read out of data tracks on a recorded medium, comprising: an optical pick-up for reading data out of said data tracks; a focusing circuit for focusing at least one beam of light on said recorded medium; a tracking circuit for positioning said beam of light on said data tracks; a photodetector having a plurality of photodiodes with means for generating a data signal, a focusing-error signal as an actual value for said focusing circuit, and a tracking-error signal as an actual value for said tracking circuit from said beam of light reflected by said recorded medium onto said photodetector, said data signal corresponding to data read out of said data tracks; a tracking control amplifier in said tracking circuit; means for applying an offset compensation voltage to one input of said tracking control amplifier, said tracking error signal being generated from photovoltages of predetermined ones of said photodiodes, said tracking circuit having an operating point, said means for applying said offset-compensation voltage varying said offset-compensation voltage until one of said photovoltages is equal to the sum of said offset-compensation voltage and of another one of said photovoltages to maintain the operating point of the tracking circuit at an optimal midpoint; one photodiode with photovoltage for generating said tracking-error signal having an electrode connected to an inverting input of said tracking control amplifier; comparator means and a series circuit having a low-pass filter and a rectifier, said comparator means having an inverting input connected to said electrode of said one photodiode through said series circuit; another photodiode with photovoltage for generating the tracking-error signal having an electrode connected to an on-inverting input of said tracking control amplifier; another series circuit having another low-pass filter and another rectifier, said comparator means having a non-inverting input connected to the electrode of said other photodiode through said other series circuit; control means having an input connected to an output of said comparator means; a digital-to-analog converter having an input connected to a first output of said control means; said digital-to-analog converter having an output connected to the non-inverting input of said tracking control amplifier.

2. An arrangement as defined in claim 1, including first and second amplifiers, one of said first and second amplifiers being connected between each said predetermined photodiode and each said low-pass filter.

3. An arrangement as defined in claim 2, including two controlled switches for disconnecting inputs of said first and second amplifiers from said predetermined photodiodes and connecting the inputs of said first and second amplifiers to a reference voltage; said controlled switches having control inputs connected to a second output of said control means; another digital-to-analog converter having an output connected to one input of one of said first and second amplifiers, said digital-to-analog converter having an input connected to a third output of said control means.

4. An arrangement as defined in claim 3, wherein said control means comprises a microprocessor.

5. An arrangement as defined in claim 2, wherein said rectifiers can construct peak, effective, or means values.

6. An arrangement as defined in claim 1, wherein said control means comprises a microprocessor.

7. An arrangement for playing back data read out of data tracks on a recorded medium, comprising; an optical pick-up for reading data out of said data tracks; a focusing circuit for focusing at least one beam of light on said recorded medium; a tracking circuit for positioning said beam of light on said data tracks; a photodetector having a plurality of photodiodes with means for generating a data signal, a focusing-error signal as an actual value for said focusing circuit, and a tracking-error signal as an actual value for said tracking circuit from said beam of light reflected by said recorded medium onto said photodetector, said data signal corresponding to data read out of said data tracks; a tracking control amplifier in said tracking circuit; means for applying an offset-compensation voltage to one input of said tracking control amplifier, said tracking error signal being generated from photovoltages of predetermined ones of said photodiodes, said tracking circuit having an operating point, said means for applying said offset-compensation voltage varying said offset-compensation voltage until one of said photovoltages is equal to the sum of said offset-compensation voltage and of another one of said photovoltages to maintain the operating point of the tracking circuit at an optimal midpoint; a first one of said predetermined didoes having a first electrode with a photovoltage for generating said tracking-error signal; a differential amplifier, said first electrode being connected to an inverting input of said tracking control amplifier and an inverting input of said differential amplifier; a second one of said predetermined photodiodes having a photovoltage for generating said tracking-error signal and being connected to a non-inverting input of said tracking control amplifier and to a non-inverting input of said differential amplifier; a low-pass filter with input connected to an output of said differential amplifier; a first comparator connected to an output of said low-pass filter through a capacitor; a second comparator and a controlled switch, said output of said low-pass filter being connected also to an input of said second comparator through said controlled switch; control means with a first input connected to an output of said first comparator, said output of said first comparator being also connected to a control input of said controlled switch, said first comparator having another input at reference potential; said second comparator having another input also at reference potential, said other input of said second comparator being connected to one input of said second comparator through another capacitor; said control means having a second input connected to an output of said second comparator; a digital-to-analog converter with input connected to an output of said control means; said digital-to-analog converter having an output connected to a non-inverting input of said tracking control amplifier.

8. An arrangement as defined in claim 7, wherein said control means comprises a microprocessor.

9. An arrangement for playing back data read out of data tracks on a recorded medium, comprising: an optical pickup for reading data out of said data tracks; a focusing circuit for focusing at least one beam of light on said recorded medium; a tracking circuit for positioning said beam of light on said data tracks; a photodetector having a plurality of photodiodes with means for generating a data signal, a focusing-error signal as an actual value for said focusing circuit, and a tracking-error signal as an actual value for said tracking circuit from said beam of light reflected by said recorded medium onto said photodetector, said data signal corresponding to data read out of said data tracks; a tracking control amplifier in said tracking circuit; means for applying an offset-compensation voltage to one input of said tracking control amplifier, said tracking error signal being generated from photovoltages of predetermined ones of said photodiodes, said tracking circuit having an operating point, said means for applying said offset-compensation voltage varying said offset-compensation voltage until one of said photovoltages is equal to the sum of said offset-compensation voltage and of another one of said photovoltages to maintain the operating point of the tracking circuit at an optimal midpoint; a first one of said predetermined photodiodes having a first electrode with a photovoltage for generating said tracking-error signal; a differential amplifier, said first-electrode being connected to an inverting input of said tracking control amplifier and an inverting input of said differential amplifier; a second one of said predetermined photodiodes having a photovoltage for generating said tracking-error signal and being connected to an on-inverting input of said tracking control amplifier and to a non-inverting input of said differential amplifier; a low-pass filter with input connected to an output of said differential amplifier; a first comparator connected to an output of said low-pass filter through a capacitor; a second comparator and a controlled switch, said output of said low-pass filter being connected also to an input of said second comparator through said controlled switch; control means with a first input connected to an output of said first comparator, said output of said first comparator being also connected to a control input of said controlled switch, said first comparator having another input at reference potential; said second comparator having another input also at reference potential, said other input of said second comparator being connected to one input of said second comparator through another capacitor; said control means having a second input connected to an output of said second comparator; a digital-to-analog converter with input connected to an output of said control means; said digital-to-analog converter having an output connected to a non-inverting input of said tracking control amplifier; two controlled switches, said differential amplifier having inputs disconnectable from said predetermined photodiodes and connectable to a reference voltage by said two controlled switches; said controlled switches having control inputs connected to a second output of said control means; another digital-to-analog converter with output connected to one input of said differential amplifier, said digital-to-analog converter having an input connected to a third output of said control means.

10. An arrangement as defined in claim 7, wherein said control means comprises a microprocessor.

* * * * *